United States Patent
Seto et al.

(10) Patent No.: US 7,608,294 B2
(45) Date of Patent: Oct. 27, 2009

(54) TRANSPARENT SUBSTRATE WITH TRANSPARENT CONDUCTIVE FILM, METHOD OF MANUFACTURING THE SAME, AND PHOTOELECTRIC CONVERSION ELEMENT INCLUDING THE SUBSTRATE

(75) Inventors: Yasunori Seto, Minato-Ku (JP); Hidemasa Yoshida, Minato-Ku (JP); Akira Fujisawa, Minato-Ku (JP); Yukio Sueyoshi, Minato-Ku (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 527 days.

(21) Appl. No.: 10/558,663

(22) PCT Filed: Nov. 18, 2004

(86) PCT No.: PCT/JP2004/017179

§ 371 (c)(1),
(2), (4) Date: Nov. 29, 2005

(87) PCT Pub. No.: WO2005/050675

PCT Pub. Date: Jun. 2, 2005

(65) Prior Publication Data

US 2007/0026240 A1 Feb. 1, 2007

(30) Foreign Application Priority Data

Nov. 18, 2003 (JP) ............................ 2003-388215

(51) Int. Cl.
*B05D 5/12* (2006.01)
(52) U.S. Cl. .................... 427/126.3; 427/109; 427/165
(58) Field of Classification Search ................. 427/108, 427/109
See application file for complete search history.

(56) References Cited

U.S. PATENT DOCUMENTS

| 4,732,621 A | 3/1988 | Murata et al. |
| 6,380,480 B1 | 4/2002 | Norimatsu et al. |
| 7,259,085 B2 * | 8/2007 | Fujisawa et al. ............ 438/608 |

(Continued)

FOREIGN PATENT DOCUMENTS

EP   1 343 177 A1   9/2003

(Continued)

*Primary Examiner*—David Turocy
(74) *Attorney, Agent, or Firm*—Hamre, Schumann, Mueller & Larson, P.C.

(57) ABSTRACT

The present invention provides a transparent substrate with a transparent conductive film that is thin but has a surface with concavities and convexities of increased height. A manufacturing method of the present invention includes a process of forming a transparent conductive film containing crystalline metal oxide as its main component on a transparent substrate by a pyrolytic oxidation method. In the method, a gaseous material containing a metal compound, an oxidizing material, and hydrogen chloride is supplied onto the transparent substrate. The process includes sequentially: a first step in which a mole ratio of the hydrogen chloride to the metal compound in the gaseous material is 0.5 to 5; and a second step in which the mole ratio is 2 to 10 and is higher than the mole ratio to be employed in the first step. With the present invention, a transparent substrate with a transparent conductive film can be provided that has a haze ratio of at least 15% and includes a transparent conductive film whose thickness is 300 nm to 750 nm.

7 Claims, 5 Drawing Sheets

U.S. PATENT DOCUMENTS

| | | |
|---|---|---|
| 2003/0170437 A1 | 9/2003 | Kawashima et al. |
| 2004/0146720 A1 | 7/2004 | Ichiki et al. |
| 2005/0000564 A1* | 1/2005 | Sato et al. .................. 136/256 |

FOREIGN PATENT DOCUMENTS

| | | | |
|---|---|---|---|
| JP | 61-288314 | | 12/1986 |
| JP | 61-288473 | | 12/1986 |
| JP | 5-67797 | | 3/1993 |
| JP | 10-283847 | | 10/1998 |
| JP | 2002-252361 | | 9/2002 |
| JP | 2003-60217 | | 2/2003 |
| JP | 2003-229584 | | 8/2003 |
| WO | 03/036657 | | 5/2003 |
| WO | WO03/036657 | * | 5/2003 |
| WO | WO 03/050324 | * | 6/2003 |

* cited by examiner

TRANSPARENT SUBSTRATE WITH TRANSPARENT CONDUCTIVE FILM, METHOD OF MANUFACTURING THE SAME, AND PHOTOELECTRIC CONVERSION ELEMENT INCLUDING THE SUBSTRATE

TECHNICAL FIELD

The present invention relates to a transparent substrate with a transparent conductive film in which a transparent conductive film is formed on a transparent substrate, a method of manufacturing the same, and a photoelectric conversion element including the transparent substrate with a transparent conductive film as a member thereof.

BACKGROUND ART

Transparent substrates with a transparent conductive film that each includes a transparent substrate, such as glass, and a transparent conductive film formed thereon are used for photoelectric conversion elements, optical sensors, image displays, light emitting devices, etc., with a functional thin film further being formed on the transparent conductive film. Examples of the image displays include liquid crystal displays, organic EL displays, and plasma displays. Examples of the light emitting devices include field emission displays (FEDs), light emitting diodes, and solid state lasers.

The transparent substrates with a transparent conductive film also are used as, for instance, window glass for buildings, window glass of refrigerators for stores, and document glass of copying machines, specifically Low-E (Low-Emissivity) glass, electromagnetic wave shielding glass, and defogging glass.

A photoelectric conversion element is an energy conversion element that converts optical energy into electric energy or vice versa. A solar cell converts optical energy into electric energy. A solar cell with a silicon semiconductor thin film includes a configuration in which a silicon semiconductor film (a photoelectric conversion layer) with a photoelectric conversion function and a back electrode film are formed sequentially on the transparent conductive film of a transparent substrate with a transparent conductive film.

Sunlight that has entered the transparent substrate with a transparent conductive film from the transparent substrate side passes through the transparent conductive film to reach the photoelectric conversion layer. Electric energy produced in the photoelectric conversion layer is taken out through the transparent conductive film and the back electrode film.

In order to improve the sunlight conversion efficiency, it is desirable to increase the amount of light that reaches the photoelectric conversion layer. An effect of improving the conversion efficiency also is provided when concavities and convexities are formed at the surface of the transparent conductive film to confine light in the photoelectric conversion layer. Many experiments and proposals have been made with respect to the techniques for forming concavities and convexities at the surface of the transparent conductive film.

JP61(1986)-288314A and JP61(1986)-288473A each disclose a technique for forming concavities and convexities by chemically etching the surface of a transparent conductive film. This technique, however, results in lower productivity since it is necessary to employ additional processes such as an etching process, a process for removing an etchant by water washing, a drying process to be carried out after the water washing, etc.

WO03/36657 discloses a technique for forming a first undercoating layer that is tin oxide formed in a discontinuous dome shape, a second undercoating layer that is a continuous silicon oxide film, and a continuous tin oxide conductive film on a transparent substrate in this order. However, when this technique is used to form concavities and convexities with a height of at least 200 nm, unevenness in haze is caused that can be observed visually. The substrate with a transparent conductive film formed using a dome-shaped undercoating still is susceptible to improvement.

JP5(1993)-67797A discloses a transparent conductive substrate for solar cells that includes a crystalline tin oxide film formed of two layers on a glass sheet. In this substrate, tin oxide of the lower layer is oriented in a (110) plane while tin oxide of the upper layer is oriented in a (200) plane. FIG. 16 of JP5(1993)-67797A shows the relationship between the thickness of the lower layer and the haze ratio of the whole film. According to this figure, the haze ratio of the whole film is not higher than about 10%.

DISCLOSURE OF THE INVENTION

Generally, in a crystalline metal oxide film, crystal grains of metal oxide are grown and thereby concavities and convexities present at the surface of the film increase in size. However, when the crystal grains simply are grown, the thickness of the transparent conductive film increases to deteriorate the transparency of the film while the adhesion of the film to the substrate deteriorates due to the residual stress of the transparent conductive film.

The present invention is intended to provide a new manufacturing method that is used suitably for obtaining a transparent substrate with a transparent conductive film that is thin but has a surface with concavities and convexities of increased height (that is, a higher haze ratio). Furthermore, the present invention also is intended to provide a new transparent substrate with a transparent conductive film that can be manufactured by the above-mentioned method, and a photoelectric conversion element including the transparent substrate as a member thereof.

The manufacturing method of the present invention includes a process of forming a transparent conductive film containing crystalline metal oxide as its main component on a transparent substrate by a pyrolytic oxidation method. In the pyrolytic oxidation method, a gaseous material containing a metal compound, an oxidizing material, and hydrogen chloride is supplied onto the transparent substrate. The process includes sequentially: a first step in which a mole ratio of the hydrogen chloride to the metal compound in the gaseous material is 0.5 to 5; and a second step in which the mole ratio is 2 to 10 and is higher than the mole ratio to be employed in the first step.

The substrate with a transparent conductive film of the present invention includes a transparent substrate and a transparent conductive film that is formed on the transparent substrate and that contains crystalline metal oxide as its main component. In the substrate, the transparent conductive film has a thickness of 300 nm to 750 nm. The transparent substrate with a transparent conductive film has a haze ratio of at least 15%.

Furthermore, the present invention also provides a photoelectric conversion element including the above-mentioned transparent substrate with a transparent conductive film.

In the present invention, the mole ratio of the hydrogen chloride to the metal compound in the gaseous material is controlled in the process of forming a transparent conductive film containing crystalline metal oxide as its main component. In addition, the present invention employs at least two gaseous materials that are different in the mole ratio from each other. When the ratio of the hydrogen chloride is controlled suitably in the gaseous material, a substrate with a transparent conductive film can be obtained that has a haze ratio of at least 15% even when the transparent conductive film is as thin as 300 nm to 750 nm. This substrate is excellent in optical transparency and provides a great effect of scattering light at the surface of the transparent conductive film. The efficient use of characteristics of this substrate makes it possible to obtain a transparent substrate with a transparent conductive film that is excellent in not only optical transparency and optical scattering but also conductivity.

Hence, in the photoelectric conversion element of the present invention, a smaller amount of incident light is absorbed by the transparent substrate with a transparent conductive film and therefore the incident light tends to become scattered light to reach a photoelectric conversion layer. Furthermore, the photoelectric conversion layer has a great optical confinement effect, which improves the efficiency of using incident sunlight. In addition, the photoelectric conversion element of the present invention includes a thin transparent conductive film. Accordingly, it has a high adhesion between the transparent conductive film and the transparent substrate and therefore is excellent in long term stability.

When the transparent conductive film is formed, with the mole ratio of the hydrogen chloride to the metal compound being controlled, the form of crystals of the transparent conductive film can be controlled into a preferable state. This makes it easier to obtain a substrate with a transparent conductive film that is thin but allows a high haze ratio to be obtained and that prevents unevenness in haze from occurring.

BEST MODE FOR CARRYING OUT THE INVENTION

Figure 1:
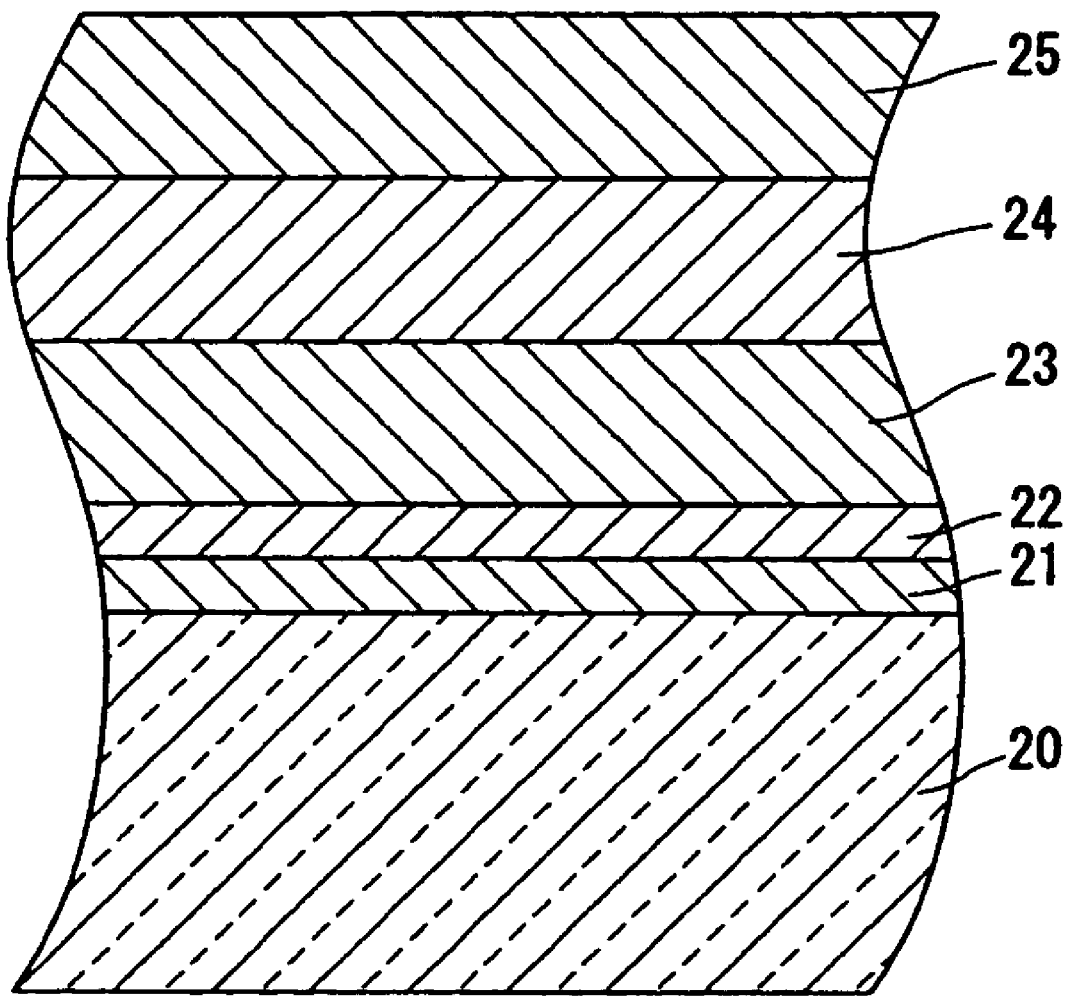
FIG. 1 is a cross-sectional view showing an example of the photoelectric conversion element according to the present invention.

The transparent conductive film contains crystalline metal oxide as its main component. In this case, the crystalline metal oxide denotes metal oxide whose X-ray diffraction pattern has peaks of its crystals. Examples of the metal oxide include indium oxide, indium oxide doped with tin, titanium oxide, tin oxide, and tin oxide doped with fluorine or antimony. However, a metal oxide film containing titanium oxide or tin oxide as its main component has advantages that it has excellent chemical resistance and can be formed using inexpensive raw materials. Preferable transparent conductive films include a tin oxide film doped with fluorine.

In this specification, an expression, "containing a component as a main component" denotes that the content by percentage of the concerned component is at least 50 wt %, as is used commonly. The content by percentage of the concerned component is preferably at least 70 wt %, more preferably at least 90 wt %.

The transparent conductive film has a thickness of 300 nm to 750 nm, preferably 450 nm to 750 nm. When the thickness of the film exceeds 750 nm, the magnitude of adhesion of the film may be lower than that required practically, due to the residual stress of the film. On the other hand, when the film is thinner than 300 nm, the haze ratio to be obtained is not high and thereby the light scattering effect to be obtained is not sufficiently great.

In the transparent substrate with a transparent conductive film of the present invention, with respect to the peak area corresponding to the plane (orientation plane) in which crystalline oxide is oriented, which is calculated from the X-ray diffraction pattern, when the peak area of the (110) plane is set at 100, it is advantageous to form the transparent conductive film, with crystal growth being controlled so that the peak areas of all the orientation planes other than the (110) plane are preferably 80 or smaller, more preferably 70 or smaller. A tin oxide film tends to be obtained that is thinner but has concavities and convexities of increased height with an increase in the extent to which crystalline metal oxide is oriented in the (110) plane preferentially over the other orientation planes. It is further preferable that the (211) plane have the largest peak area after the (110) plane (that is to say, the (211) plane has the second largest peak area).

Generally, the transparent conductive film is formed on the transparent substrate by a so-called physical vapor deposition method, such as a sputtering method, a vacuum deposition method, etc., or a chemical deposition method involving a pyrolytic oxidation reaction, such as a spray method, a chemical vapor deposition method (a CVD method), etc.

In the present invention, the transparent substrate with a transparent conductive film is manufactured using the CVD method. In the CVD method, gaseous materials are decomposed with the thermal energy of a high-temperature transparent substrate.

A suitable metal compound to be added to a gaseous material to produce crystalline metal oxide that forms the transparent conductive film is chloride, specifically, organic metal chloride or inorganic metal chloride. When organic metal chloride is used, carbide that is produced through the pyrolytic reaction remains in the film to hinder the film from having high transparency and further an organic component that is produced subsidiarily becomes a factor of imposing a load on the environment. Hence, it is advantageous to use inorganic metal chloride as the metal compound to be added to the gaseous material. Tin oxide that is a preferable metal oxide can be obtained using a tin compound as the metal compound.

Examples of the inorganic metal chloride include indium chloride, zinc chloride, titanium chloride, and tin chloride (stannous chloride or stannic chloride (tin tetrachloride)). When consideration is given to the chemical resistance of the metal oxide to be produced, the cost of raw materials, etc, titanium chloride and tin chloride are preferable, and tin tetrachloride is particularly preferable as the tin chloride.

Examples of the oxidizing material to be added to the gaseous materials include oxygen, water, water vapor, and dry air. Preferably, water vapor is used.

When inorganic metal chloride, particularly tin tetrachloride, and water vapor are mixed together, the oxidation reaction progresses rapidly to produce solid tin oxide, and it may accumulate inside a pipe for supplying the gaseous material to block the pipe. In addition, even if the gaseous material can be supplied, probably the composition of the gaseous material may vary and thereby the adhesion between the transparent substrate and the transparent conductive film may deteriorate.

Hydrogen chloride serves to prevent the oxidation reaction from occurring between tin tetrachloride and water vapor. Hence, when the pyrolytic oxidation reaction progresses in an atmosphere including hydrogen chloride, the transparent conductive film can be formed stably on the transparent substrate. It is advantageous to add hydrogen chloride to at least one of tin tetrachloride and water vapor that have not been mixed together yet or both of them.

In the manufacturing method of the present invention, the transparent conductive film is formed through the process of forming a transparent conductive film that includes at least: a first step in which the mole ratio of the hydrogen chloride to the metal compound is 0.5 to 5, preferably 0.8 to 5, and more preferably 1 to 5; and a second step in which the mole ratio is 2 to 10 and is higher than the mole ratio to be employed in the first step. The mole ratio to be employed in the first step is preferably lower than 4, more preferably 3 or lower, while the mole ratio to be employed in the second step is preferably at least 3.

In the first step, a lot of crystalline initial grains are formed on the transparent substrate due to the lower mole ratio of the hydrogen chloride. In the second step, crystals of the metal oxide grow, with the crystalline initial grains serving as starting points. In the first step, the amount and size of the crystalline initial grains can be adjusted by adjusting the above-mentioned mole ratio. In the first step, it is preferable that a very thin metal oxide film be formed and a number of initial grains be formed. In the second step, a gaseous material in which the above-mentioned mole ratio is relatively high is supplied to promote the growth of crystals of the metal oxide using the initial grains as starting points and thereby crystals that are large in diameter and long in the thickness direction can be formed.

The process of forming a transparent conductive film further may include a third step after the second step. In this case, the mole ratio of the hydrogen chloride to the metal compound that is employed in the third step can be determined according to a desirable crystal growth rate. Basically, the crystal growth rate can be adjusted suitably according to the type of metal, the diameter and length of crystals to be obtained, etc. When a high growth rate is desirable, it is preferable that the above-mentioned mole ratio to be employed in the third step be set at a lower ratio than the above-mentioned ratio to be employed in the second step and further be set at a lower ratio than the above-mentioned ratio to be employed in the first step, specifically lower than 1.5 and preferably lower than 1. In the present invention, the hydrogen chloride is used to prevent the metal oxide from reacting in the gaseous material in the first and second steps. Hence, it is preferable that in the third step, the above-mentioned mole ratio is controlled to be in the range described above to promote crystal growth and thereby a desirable film thickness be obtained.

The process of forming a transparent conductive film further may include a fourth step and a fifth step that are employed suitably after the third step. In the case of growing crystals through a plurality of steps after the second step, as in the above, it is preferable that the mole ratios of the hydrogen chloride to the metal compound to be employed in such a plurality of steps be adjusted so as to be as low as described above, as a whole, for instance, to be lower as a whole than the above-mentioned mole ratio that is employed in the second step.

Crystals of metal oxide such as tin oxide grow into a shape of pillar and the growth is accompanied by an increase in grain diameter. Accordingly, the number of initial grains is preferably small in order to form tin oxide crystals with large diameters. However, an excessively small number of initial grains results in appearance of huge crystals in the second step. The huge crystals then may cause spots and stains and further may cause partial unevenness in haze.

With the method described above, crystalline metal oxide that is oriented in the (110) plane preferentially can be formed on the transparent substrate. Furthermore, the transparent conductive film is obtained in which pillar-shaped crystals with large grain sizes that have grown from the vicinity of the surface of the transparent substrate are in close contact with each other. Hence, even if the transparent conductive film is thinner, a high haze ratio can be maintained.

In the film in which crystals with large grain sizes that have grown from the vicinity of the surface of the transparent substrate are in close contact with each other, the number of grain boundaries decreases. The decrease in the number of grain boundaries that cause scattering of carriers allows the mobility of the carriers to improve. Accordingly, even when the transparent conductive film is thinner, excellent conductivity can be maintained. Since the transparency can be improved, with the conductivity being maintained, this transparent substrate with a transparent conductive film can contribute to the improvement in efficiency of converting sunlight in a photoelectric conversion element.

In order to improve the conductivity of the transparent conductive film containing tin oxide as its main component, the transparent conductive film can be doped with a small amount of fluorine. Examples of the fluorine compound to be added to the gaseous material include hydrogen fluoride, difluoroethane, chlorodifluoromethane, trifluoroacetic acid, and bromotrifluoromethane. However, hydrogen fluoride that is free from organic materials is preferable.

The gaseous material is prepared typically by mixing tin tetrachloride, an oxidizing material, hydrogen chloride, a fluorine-containing compound, and a gaseous diluent together and then is supplied onto the transparent substrate. When those raw materials are not mixed together well, unevenness in composition and unevenness in thickness of the film tend to be caused due to the unevenness in the composition of the gaseous material. The respective components of the gaseous material need to be in a gaseous state after being mixed together but can be liquid or solid before being mixed together as long as they can be supplied quantitatively.

The pyrolytic oxidation reaction progresses on the transparent substrate heated to a high temperature. Preferably, the surface temperature of the transparent substrate is 400° C. to 800° C., particularly at least 600° C. When the transparent substrate has a surface temperature of at least 600° C., the metal oxide thin film that has been formed is crystallized easily. Thereby conductivity improves and the rate at which the metal oxide thin film grows increases.

The CVD method involving the pyrolytic oxidation of the gaseous material can be carried out, for instance, as follows: a transparent substrate that has been cut into a predetermined size is placed on a mesh belt to pass through a heating furnace, and when the temperature of the transparent substrate reaches a predetermined temperature, the gaseous material is supplied. It, however, is preferable that the CVD method be the so-called on-line CVD method in which the transparent substrate is a glass ribbon located on a molten metal bath in a process of manufacturing glass by the float glass process, particularly a glass ribbon whose surface temperature is at least 600° C. With this method, a high temperature state of the transparent substrate can be obtained easily and it is possible to obtain a transparent substrate with a transparent conductive film without supplying additional energy for heating the transparent substrate to a high temperature.

The on-line CVD method in which a gaseous material containing hydrogen chloride mixed thereinto is used makes it possible to manufacture a large-area transparent substrate with a transparent conductive film stably and continuously for a long period of time at a higher speed.

The transparent conductive film may be formed directly on the transparent substrate. However, at least one undercoating layer, preferably two undercoating layers, may be provided on the transparent substrate beforehand and then the transparent conductive film may be formed thereon. The undercoating layer(s) prevents the occurrence of phenomena that can be caused due to the combination of the transparent substrate and the transparent conductive film and that should be avoided. An example of such phenomena is a phenomenon that an alkaline component diffuses from glass that is the transparent substrate to lower the conductivity of the transparent conductive film.

The undercoating layer(s) also can provide unique advantageous functions, for instance, a function of reducing the amount of light reflected by the interface between the transparent substrate and the metal oxide film, and a function of improving the adhesion between the transparent substrate and the metal oxide film. The undercoating layer(s) may consist of a plurality of layers according to the purpose of providing it(them).

When one undercoating layer is employed, it is preferably a film that has a thickness of 40 nm to 120 nm and is formed of a material whose refractive index is 1.5 to 1.8. An example of the material whose refractive index is in the above-mentioned range is silicon oxycarbide. When two undercoating layers are employed, preferably a first undercoating layer located on the transparent substrate side is a film that has a thickness of 10 nm to 100 nm and is formed of a material whose refractive index is 1.6 to 2.4 while a second undercoating layer located on the transparent conductive film side is a film that has a thickness of 10 nm to 100 nm and is formed of a material whose refractive index is 1.4 to 1.8. Examples of the material whose refractive index is 1.6 to 2.4 include tin oxide, indium oxide, and zinc oxide. Examples of the material whose refractive index is 1.4 to 1.8 include silicon oxide, aluminum oxide, and silicon oxycarbide.

The method of forming the undercoating layer(s) is not particularly limited. However, when the same method as that employed for forming the transparent conductive film is used for forming the undercoating layer(s), the control of the whole processes of manufacturing the transparent substrate with a transparent conductive film is facilitated. Among others an on-line CVD method is particularly preferable in which a layer and a metal oxide film are formed successively by the same method.

When glass containing an alkaline component is used as the transparent substrate, it is advantageous that an alkali barrier layer that serves as a barrier to the alkaline component, such as a silicon oxide film, a silicon oxycarbide film, etc., is formed as the undercoating layer so as to prevent the alkaline component from diffusing into the transparent conductive film. In order to bond the transparent substrate and the alkali barrier layer to each other with higher strength, it is further preferable that a metal oxide undercoating layer be interposed therebetween.

Examples of the silicon material to be used in forming a silicon oxide film by the pyrolytic oxidation method include monosilane, disilane, trisilane, monochlorosilane, dichlorosilane, dimethylsilane, trimethylsilane, and tetramethyl disilane. Among others monosilane is particularly preferable. Examples of the oxidizing material to be used in this case include oxygen, water, water vapor, dry air, carbon dioxide, carbon monoxide, and nitrogen dioxide. Among others oxygen is particularly preferable. When monosilane is used as the silicon material, an unsaturated hydrocarbon gas such as ethylene, acetylene, toluene, etc. may be added to control the reaction between the monosilane and the oxidizing material and to control the refractive index of the film to be obtained.

A metal oxide film may be formed between the silicon oxide film and the transparent substrate to strengthen the adhesion therebetween and to reduce the amount of light reflected at the interface therebetween. In this case, the use of the same type of metal compound as that to be used for forming the transparent conductive film facilitates the control of the whole process. Preferably, this film also is formed by the same method as that employed in forming the transparent conductive film, particularly the on-line CVD method. When this metal oxide film is a tin oxide film, it is not necessary to add hydrogen chloride to the gaseous material to be used for forming the tin oxide film.

The photoelectric conversion element can be obtained by forming a photoelectric conversion layer and a back electrode layer sequentially on a transparent substrate with a transparent conductive film according to a well-known method. FIG. 1 shows a cross-sectional view of an example of the photoelectric conversion element. In this photoelectric conversion element, a substrate with a transparent conductive film is composed of a transparent substrate 20, a first undercoating layer 21, a second undercoating layer 22, and a transparent conductive film 23, and further a photoelectric conversion layer 24 and a back electrode film 25 are formed on the transparent conductive film 23.

Preferably, the photoelectric conversion layer 24 is formed of layers of photoreactive semiconductor thin films that absorb received light to produce photocarriers. The photoelectric conversion layer to be used in general is formed of layers of amorphous-silicon-based semiconductor thin films, layers of non-single-crystal-silicon-based crystalline semiconductor thin films, or layers of semiconductor thin films that are a combination thereof. It is preferable that specifically, a p-type silicon semiconductor film, an i-type silicon semiconductor film, and an n-type silicon semiconductor film be stacked in this order from the transparent substrate side to form a silicon-based semiconductor photoelectric conversion layer with a multilayered structure.

Generally, a metal thin film is used for the back electrode film 25. A metal oxide thin film may be formed between the n-type silicon film and the back electrode film to prevent the silicon film and the metal thin film (the back electrode film) from being alloyed and thereby to improve the functional stability of both the films.

The surface shape of the transparent conductive film affects the photoelectric conversion efficiency of the photoelectric conversion layer. Excessively large elevation angles of convexities present at the surface of the transparent conductive film result in an increase in the number of lattice defects of pn(pin) junctions in the photoelectric conversion layer. In addition, when the convexities have large elevation angles and the concavities present at the film surface have steep gradients, a short-circuit current (Jsc) decreases. Furthermore, when the convexities have large elevation angles and thereby have sharp peaks and steep ridgelines, an open circuit voltage (Voc) decreases. On the other hand, excessively small elevation angles of the convexities result in a decrease in haze ratio of the transparent substrate with a transparent conductive film and thereby a sufficiently great optical confinement effect cannot be obtained. With consideration given to the above, the average (the elevation angle average) of elevation angles of the convexities present at the surface of the transparent conductive film is preferably 20 degrees to 30 degrees.

The haze ratio of the transparent substrate with a transparent conductive film also is affected by the diameters of convexities of the transparent conductive film. From this point of view, the average (the convexity diameter average) of diameters of the convexities present at the surface of the transparent conductive film is preferably 300 nm to 500 nm.

It is preferable that the surface of the transparent conductive film include no dome-shaped convexities that project locally. This is because the presence of such convexities results in unevenness in haze that tends to develop in the transparent substrate with a transparent conductive film.

Figure 2:
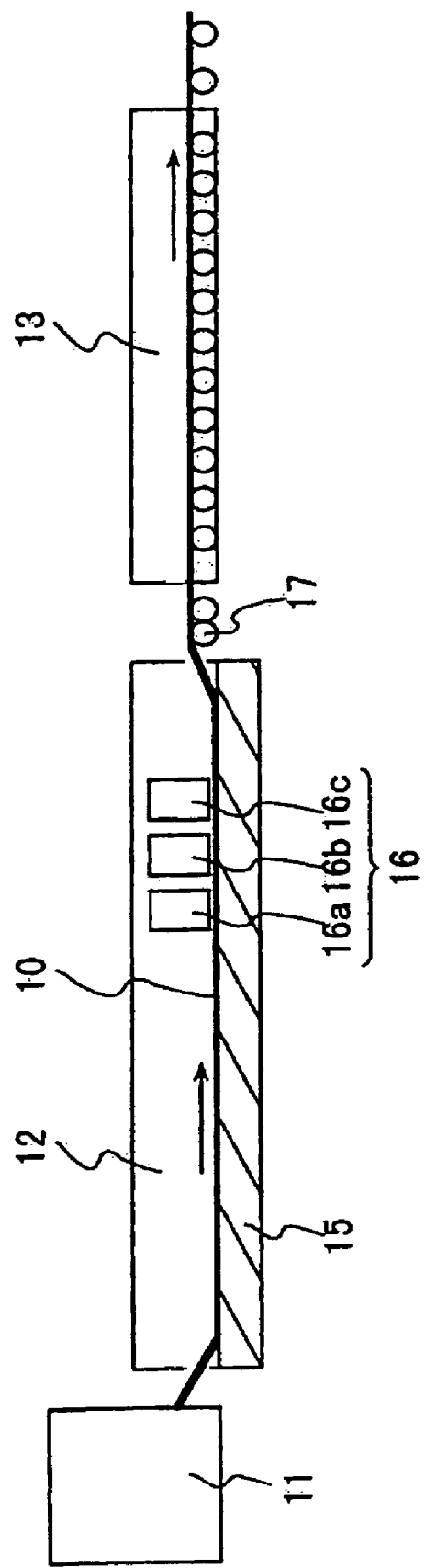
FIG. 2 is a diagram showing the configuration of an example of the apparatus that is used for manufacturing the transparent substrate with a transparent conductive film of the present invention by the so-called "on-line CVD method".

FIG. 2 is a conceptual diagram showing an example of the apparatus to be used in the on-line CVD method. A glass material is poured from a melting furnace (a float furnace) 11 into a float bath 12 to be formed into a glass ribbon 10. The glass ribbon 10 moves on a molten tin bath 15 to become semisolid. Thereafter, this is lifted with a roller 17 and then is carried into an annealing furnace 13. The glass ribbon solidified in the annealing furnace 13 is cut into a glass sheet with a predetermined size using a cutting device, which is not shown in the figure.

The float bath 12 includes a predetermined number of coaters 16 (three coaters 16a, 16b, and 16c in the embodiment shown in the figure) that are disposed over the molten tin bath 15 at a predetermined distance from the surface of the glass ribbon 10 whose temperature is high. These coaters supply gaseous materials and thereby, an undercoating film and a transparent conductive film are formed successively on the glass ribbon 10 in this order. In the method of manufacturing a transparent substrate with a transparent conductive film of the present invention, when one undercoating layer is to be formed first and then a transparent conductive film is to be formed through two processes, the undercoating layer is formed with the coater 16a located on the furthest upstream side in the float bath and then the transparent conductive film is formed using the coaters 16b and 16c.

When at least four coaters 16 are disposed, the transparent substrate with a transparent conductive film can be formed of a plurality of undercoating layers and an increased number of transparent conductive films. Moreover, after the glass ribbon 10 provided with the respective films formed on the surface thereof comes out of the float bath 12, an additional thin film may be formed on the glass ribbon 10 by a spray method.

Hereafter, the present invention is described using examples but is not limited by the following examples.

The following descriptions are directed to the methods of measurement and evaluation of properties that are used in the descriptions of the examples.

Haze Ratio

Light is allowed to enter a transparent substrate with a transparent conductive film from the transparent substrate side and thereby the haze ratio was measured using NDH2000 manufactured by Nippon Denshoku.

Sheet Resistance

The sheet resistance was measured using a MCP-TESTER LORESTA-FP manufactured by Dia Instruments.

Peak Area

The peak area of each orientation plane was determined by multiplying the diffraction peak intensity of each orientation plane by the half-value width of the peak, wherein the diffraction peak intensity was observed in an X-ray diffraction pattern of crystals that was obtained using a RAD-RC apparatus manufactured by RIGAKU Corporation. Subsequently, the ratio of the peak area of each orientation plane to that of the (110) plane was calculated, with the peak area of the (110) plane being set at 100.

Elevation Angle Average

With an AFM (an atomic force microscope; a scanning probe microscope manufactured by THERMOMICROSCOPE), concavities and convexities that are present at the surface of a transparent conductive film were measured in a non-contact mode. Angles that each are formed between the ridge line of a convexity and the sample stage of the microscope were measured as elevation angles and then the average of the elevation angles was determined.

Convexity Diameter Average

A plan view that showed a transparent substrate with a transparent conductive film viewed from the direction perpendicular to the surface of the transparent conductive film was prepared based on the data obtained by the measurement carried out using the AFM. Thereafter the areas of the convexities that appeared in the plan view were calculated and then the average of diameters of circles that had the same areas as those of the convexities was calculated.

Thickness of Transparent Conductive Film

A predetermined region of a transparent conductive film was etched using Zn powder and hydrochloric acid and then the height of steps thus formed was measured using a surface profiler (AlphaStep-500 manufactured by Tencor). The surface of the transparent conductive film was considered as a surface in which the concavities and convexities present at the surface were averaged.

EXAMPLE 1

An undercoating film and a transparent conductive film (a crystalline metal oxide film) were formed sequentially on a glass ribbon using the on-line CVD method. Specifically, 98 vol. % of nitrogen and 2 vol. % of hydrogen were supplied into the float bath while the inside of the float bath was maintained at a slightly higher pressure than that of the outside thereof. With the inside of the float bath being maintained in a nonoxidative atmosphere, a mixed gas consisting of tin tetrachloride (vapor), water vapor, hydrogen chloride, nitrogen, and helium was supplied from a first coater located on the furthest upstream side. Thereby a 55-nm thick tin oxide film (a $SnO_2$ film; a first undercoating layer) with a refractive index of 1.9 was formed on the glass ribbon. Subsequently, a mixed gas consisting of monosilane, ethylene, oxygen, and nitrogen was supplied from a second coater and thereby a 30-nm thick silicon oxide film (a $SiO_2$ film; a second undercoating layer) with a refractive index of 1.46 was formed on the first undercoating layer. Further, a mixed gas consisting of 0.58 mol % of tin tetrachloride (vapor), 11.65 mol % of water vapor, 0.70 mol % of hydrogen chloride, and nitrogen (the rest; the same holds true in the following descriptions, i.e. nitrogen accounts for the rest) was supplied from a third coater. Thus a first tin oxide film was formed on the second undercoating layer. Furthermore, a mixed gas consisting of 1.87 mol % of tin tetrachloride (vapor), 37.39 mol % of water vapor, 9.35 mol % of hydrogen chloride, and nitrogen was supplied from a fourth coater that was disposed on the further downstream side. Thereby a second tin oxide film was formed on the first tin oxide film. Subsequently, a mixed gas consisting of 3.40 mol % of tin tetrachloride (vapor), 50.99 mol % of water vapor, 0.68 mol % of hydrogen chloride, 1.19 mol % of hydrogen fluoride, and nitrogen was supplied from a fifth coater located on the furthest downstream side. Thereby a tin oxide film doped with fluorine (a $SnO_2$:F film) was formed on the second tin oxide film. Thus a transparent substrate with a transparent conductive film was obtained. The thickness of the transparent conductive film, i.e. the total of the thicknesses of the first tin oxide film, the second tin oxide film, and the tin oxide film doped with fluorine was 700 nm. The transparent substrate with a transparent conductive film thus obtained had a haze ratio of 19.5%. The transparent conductive film had a sheet resistance of 9.5Ω/□. With respect to the peak areas of crystals, the peak area of the (211) plane was 43 and the peak areas of other orientation planes were further smaller than that.

EXAMPLE 2

A transparent substrate with a transparent conductive film was obtained in the same manner as in Example 1 except that the gaseous material to be supplied from the fourth coater was a mixed gas consisting of 1.61 mol % of tin tetrachloride (vapor), 16.11 mol % of water vapor, 4.83 mol % of hydrogen chloride, and nitrogen. The thickness of the transparent conductive film was 720 nm. The transparent substrate with a transparent conductive film thus obtained had a haze ratio of 28.0%. The transparent conductive film had a sheet resistance of 10.2Ω/□. With respect to the peak areas of crystals, the peak area of the (211) plane was 38 and the peak areas of other orientation planes were further smaller than that.

EXAMPLE 3

A transparent substrate with a transparent conductive film was obtained in the same manner as in Example 2 except that the amount of the hydrogen chloride contained in the mixed gas to be supplied from the third coater was 1.40 mol %. The thickness of the transparent conductive film was 687 nm. The transparent substrate with a transparent conductive film thus obtained had a haze ratio of 36.9%. The transparent conductive film had a sheet resistance of 12.7Ω/□. With respect to the peak areas of crystals, the peak area of the (211) plane was 26 and the peak areas of other orientation planes were further smaller than that.

EXAMPLE 4

An undercoating film and a transparent conductive film (a crystalline metal oxide film) were formed sequentially on a glass ribbon using the on-line CVD method. Specifically, 98 vol. % of nitrogen and 2 vol. % of hydrogen were supplied into the float bath while the inside of the float bath was maintained at a slightly higher pressure than that of the outside thereof. With the inside of the float bath being maintained in a nonoxidative atmosphere, a mixed gas consisting of tin tetrachloride (vapor), water vapor, hydrogen chloride, nitrogen, and helium was supplied from the first coater located on the furthest upstream side. Thereby a 55-nm thick tin oxide film (a $SnO_2$ film; a first undercoating layer) with a refractive index of 1.9 was formed on the glass ribbon. Subsequently, a mixed gas consisting of monosilane, ethylene, oxygen, and nitrogen was supplied from the second coater and thereby a 30-nm thick silicon oxide film (a $SiO_2$ film; a second undercoating layer) with a refractive index of 1.46 was formed on the first undercoating layer. Further, a mixed gas consisting of 0.50 mol % of tin tetrachloride (vapor), 14.88 mol % of water vapor, 0.60 mol % of hydrogen chloride, and nitrogen was supplied from the third coater. Thus a first tin oxide film was formed on the second undercoating layer. Furthermore, a mixed gas consisting of 1.49 mol % of tin tetrachloride (vapor), 14.91 mol % of water vapor, 10.44 mol % of hydrogen chloride, and nitrogen was supplied from the fourth coater that was disposed on the further downstream side. Thereby a second tin oxide film was formed on the first tin oxide film. Subsequently, a mixed gas consisting of 3.17 mol % of tin tetrachloride (vapor), 47.48 mol % of water vapor, 0.16 mol % of hydrogen chloride, 0.55 mol % of hydrogen fluoride, and nitrogen was supplied from the fifth coater located on the furthest downstream side. Thereby a tin oxide film doped with fluorine (a $SnO_2$:F film) was formed on the second tin oxide film. Thus a transparent substrate with a transparent conductive film was obtained. The thickness of the transparent conductive film was 611 nm. The transparent substrate with a transparent conductive film thus obtained had a haze ratio of 15.5%. The transparent conductive film had a sheet resistance of 13.7Ω/□. With respect to the peak areas of crystals, the peak area of the (211) plane was 67 and the peak areas of other orientation planes were further smaller than that.

EXAMPLE 5

An undercoating film and a transparent conductive film (a crystalline metal oxide film) were formed sequentially on a glass ribbon using the on-line CVD method. Specifically, 98 vol. % of nitrogen and 2 vol. % of hydrogen were supplied into the float bath while the inside of the float bath was maintained at a slightly higher pressure than that of the outside thereof. With the inside of the float bath being maintained in a nonoxidative atmosphere, a mixed gas consisting of monosilane, ethylene, oxygen, and nitrogen was supplied from the first coater located on the furthest upstream side. Thereby a 45-nm thick silicon oxycarbide film (a SiOC film; an undercoating layer) with a refractive index of 1.65 was formed on the glass ribbon. Subsequently, a mixed gas of oxygen and nitrogen was sprayed thereon from the second coater. In this case, the oxygen concentration was 33 mol %. Further, a mixed gas consisting of 0.35 mol % of tin tetrachloride (vapor), 7.06 mol % of water vapor, 0.64 mol % of hydrogen chloride, and nitrogen was supplied from the third coater. Thus a first tin oxide film was formed on the undercoating layer. Furthermore, the same mixed gases as those used in Example 2 were supplied from the fourth and fifth coaters, respectively. Thus a transparent substrate with a transparent conductive film was obtained. The thickness of the transparent conductive film was 700 nm. The transparent substrate with a transparent conductive film thus obtained had a haze ratio of 16.5%. The transparent conductive film had a sheet resistance of 8.9Ω/□. With respect to the peak areas of crystals, the peak area of the (211) plane was 41 and the peak areas of other orientation planes were further smaller than that.

EXAMPLE 6

Non-alkali glass that had been precut into a square with a size of 10 cm×10 cm was washed and then was dried. In a belt furnace, a 55-nm thick tin oxide film (a first undercoating layer) with a refractive index of 1.9 was formed on the glass sheet that had been washed and dried. Subsequently, a 30-nm thick silicon oxide film (a second undercoating layer) with a refractive index of 1.46 was formed on the first undercoating layer. Furthermore, a mixed gas consisting of 0.30 mol % of tin tetrachloride (vapor), 9.30 mol % of water vapor, 0.78 mol % of hydrogen chloride, and nitrogen was supplied. Thus a first tin oxide film was formed on the second undercoating layer. Subsequently, a mixed gas consisting of 0.30 mol % of tin tetrachloride (vapor), 9.30 mol % of water vapor, 2.35 mol % of hydrogen chloride, and nitrogen was supplied. Thereby a second tin oxide film was formed on the first tin oxide film. Thereafter, a mixed gas consisting of 2.50 mol % of tin tetrachloride (vapor), 67.50 mol % of water vapor, 0.40 mol % of hydrogen chloride, 1.40 mol % of hydrogen fluoride, and nitrogen was supplied. Thereby a first tin oxide film doped with fluorine was formed on the second tin oxide film. Thus a transparent substrate with a transparent conductive film was obtained. The thickness of the transparent conductive film was 740 nm. The transparent substrate with a transparent conductive film thus obtained had a haze ratio of 25.5%. The transparent conductive film had a sheet resistance of 11.5Ω/□. With respect to the peak areas of crystals, the peak area of the (211) plane was 55 and the peak areas of other orientation planes were further smaller than that.

EXAMPLE 7

A first undercoating layer and a second undercoating layer were formed in the same manner as in Example 6. Further, a mixed gas consisting of 2.30 mol % of tin tetrachloride (vapor), 29.90 mol % of oxygen, 1.84 mol % of hydrogen chloride, and nitrogen was supplied. Thereby a first tin oxide film was formed on the second undercoating layer. Subsequently, a mixed gas consisting of 0.30 mol % of tin tetrachloride (vapor), 9.30 mol % of water vapor, 2.35 mol % of hydrogen chloride, and nitrogen was supplied. Thereby a second tin oxide film was formed on the first tin oxide film. Thereafter, a mixed gas consisting of 1.50 mol % of tin tetrachloride (vapor), 45.0 mol % of water vapor, 1.1 mol % of hydrogen chloride, 1.38 mol % of hydrogen fluoride, and nitrogen was supplied. Thereby a tin oxide film doped with fluorine was formed on the second tin oxide film. Thus a transparent substrate with a transparent conductive film was obtained. The thickness of the transparent conductive film was 740 nm. The transparent substrate with a transparent conductive film thus obtained had a haze ratio of 19.3%. The transparent conductive film had a sheet resistance of 9.9Ω/□. With respect to the peak areas of crystals, the peak area of the (211) plane was 38 and the peak areas of other orientation planes were further smaller than that.

EXAMPLE 8

A transparent substrate with a transparent conductive film was obtained in the same manner as in Example 3 except that: the gaseous material supplied from the third coater was a mixed gas consisting of 0.4 mol % of tin tetrachloride (vapor), 7.1 mol % of water vapor, 0.4 mol % of hydrogen chloride, and nitrogen; the gaseous material supplied from the fourth coater was a mixed gas consisting of 2.3 mol % of tin tetrachloride (vapor), 22.7 mol % of water vapor, 6.9 mol % of hydrogen chloride, and nitrogen; and the gaseous material supplied from the fifth coater was a mixed gas consisting of 2.6 mol % of tin tetrachloride (vapor), 39.5 mol % of water vapor, 0.52 mol % of hydrogen chloride, 1.12 mol % of hydrogen fluoride, and nitrogen. The thickness of the transparent conductive film was 640 nm. The transparent substrate with a transparent conductive film thus obtained had a haze ratio of 18.8%. The transparent conductive film had a sheet resistance of 10.3Ω/□. With respect to the peak areas of crystals, the peak area of the (211) plane was 44 and the peak areas of other orientation planes were not larger than 28.

EXAMPLE 9

A transparent substrate with a transparent conductive film was obtained in the same manner as in Example 3 except that: the gaseous material supplied from the third coater was a mixed gas consisting of 0.6 mol % of tin tetrachloride (vapor), 11.6 mol % of water vapor, 1.8 mol % of hydrogen chloride, and nitrogen; the gaseous material supplied from the fourth coater was a mixed gas consisting of 2.4 mol % of tin tetrachloride (vapor), 60.1 mol % of water vapor, 12.0 mol % of hydrogen chloride, and nitrogen; and the gaseous material supplied from the fifth coater was a mixed gas consisting of 2.4 mol % of tin tetrachloride (vapor), 60.1 mol % of water vapor, 2.9 mol % of hydrogen chloride, 1.46 mol % of hydrogen fluoride, and nitrogen. The thickness of the transparent conductive film was 700 nm. The transparent substrate with a transparent conductive film thus obtained had a haze ratio of 22.5%. The transparent conductive film had a sheet resistance of 11.3Ω/□. With respect to the peak areas of crystals, the peak area of the (211) plane was 32 and the peak areas of other orientation planes were not larger than 17.

COMPARATIVE EXAMPLE 1

An undercoating film and a transparent conductive film (a crystalline metal oxide film) were formed sequentially on a glass ribbon using the on-line CVD method. Specifically, 98 vol. % of nitrogen and 2 vol. % of hydrogen were supplied into the float bath while the inside of the float bath was maintained at a slightly higher pressure than that of the outside thereof. With the inside of the float bath being maintained in a nonoxidative atmosphere, a mixed gas consisting of tin tetrachloride (vapor), water vapor, hydrogen chloride, nitrogen, and helium was supplied from the first coater located on the furthest upstream side. Thereby a 55-nm thick tin oxide film (a first undercoating layer) with a refractive index of 1.9 was formed on the glass ribbon. Subsequently, a mixed gas consisting of monosilane, ethylene, oxygen, and nitrogen was supplied from the second coater and thereby a 30-nm thick silicon oxide film (a second undercoating layer) with a refractive index of 1.46 was formed on the first undercoating layer. Further, a mixed gas consisting of 0.90 mol % of tin tetrachloride (vapor), 27.06 mol % of water vapor, 0.05 mol % of hydrogen chloride, and nitrogen was supplied from the third coater. Thus a first tin oxide film was formed on the second undercoating layer. Furthermore, a mixed gas consisting of 3.05 mol % of tin tetrachloride (vapor), 30.49 mol % of water vapor, 0.15 mol % of hydrogen chloride, and nitrogen was supplied from the fourth coater that was disposed on the further downstream side. Thereby a second tin oxide film was formed on the first tin oxide film. Subsequently, a mixed gas consisting of 2.92 mol % of tin tetrachloride (vapor), 43.78 mol % of water vapor, 0.58 mol % of hydrogen chloride, 0.23 mol % of hydrogen fluoride, and nitrogen was supplied from the fifth coater located on the furthest downstream side. Thereby a tin oxide film doped with fluorine was formed on the second tin oxide film. Thus a transparent substrate with a transparent conductive film was obtained. The thickness of the transparent conductive film was 810 nm. The transparent substrate with a transparent conductive film thus obtained had a haze ratio of 14.5%. The transparent conductive film had a sheet resistance of 14.0Ω/□. With respect to the peak areas of crystals, the peak area of the (211) plane was 118 and the peak areas of other orientation planes were not larger than 94.

COMPARATIVE EXAMPLE 2

A transparent substrate with a transparent conductive film was obtained in the same manner as in Example 3 except that: the gaseous material supplied from the third coater was a mixed gas consisting of 1.7 mol % of tin tetrachloride (vapor), 58.8 mol % of water vapor, 0.34 mol % of hydrogen chloride, and nitrogen; the gaseous material supplied from the fourth coater was a mixed gas consisting of 3.2 mol % of tin tetrachloride (vapor), 31.9 mol % of water vapor, 0.16 mol % of hydrogen chloride, and nitrogen; and the gaseous material supplied from the fifth coater was a mixed gas consisting of 3.4 mol % of tin tetrachloride (vapor), 51.0 mol % of water vapor, 0.68 mol % of hydrogen chloride, 1.19 mol % of hydrogen fluoride, and nitrogen. The thickness of the transparent conductive film was 960 nm. The transparent substrate with a transparent conductive film thus obtained had a haze ratio of 25.8%. The transparent conductive film had a sheet resistance of 9.0Ω/□. With respect to the peak areas of crystals, the peak area of the (211) plane was 153 and the peak areas of other orientation planes were not larger than 88.

The results obtained in Examples 1 to 9 and Comparative Examples 1 and 2 were summarized in Table 1.

As shown in Table 1, the transparent substrates with a transparent conductive film obtained in Examples 1 to 9 each had a haze ratio of at least 15% even when their transparent conductive films each had a thickness of 750 nm or less. On the other hand, the haze ratio of the transparent substrate with a transparent conductive film obtained in Comparative Example 1 did not reach 15% even though the thickness of the transparent conductive film exceeded 750 nm. The transparent substrate with a transparent conductive film obtained in Comparative Example 2 had a high haze ratio but this was simply because the transparent conductive film was thick. In the transparent substrates with a transparent conductive film obtained in Examples 1 to 9, the crystals of tin oxide forming the transparent conductive films are oriented in the (110) plane preferentially.

Figure 3:
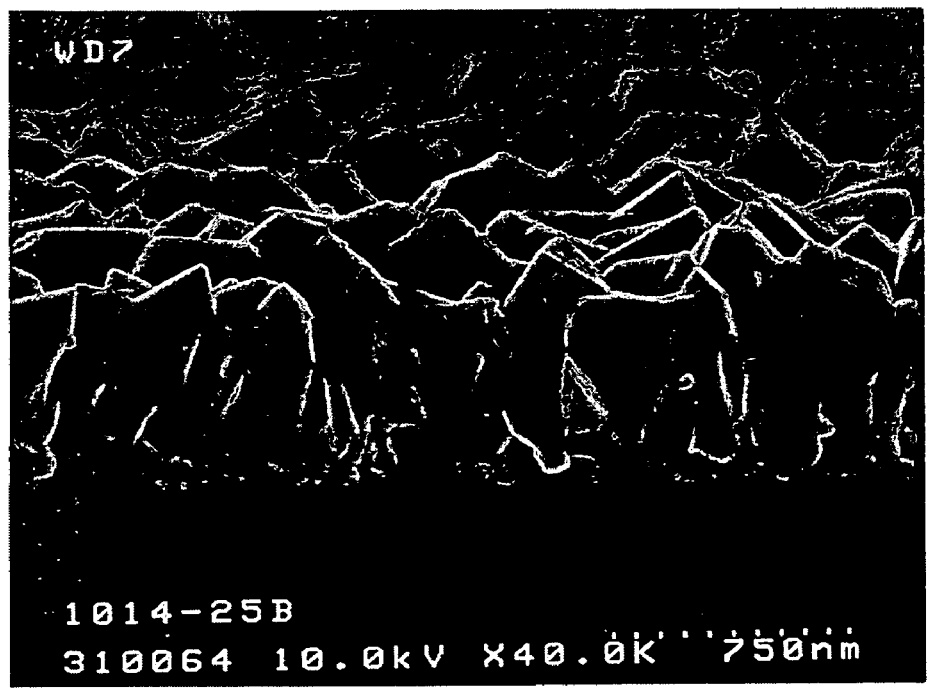
FIG. 3 is a view showing the state of the cross section of the transparent substrate with a transparent conductive film obtained in Example 1, which was observed with a scanning electron microscope (SEM) at an inclination of 10° with respect to the surface of the transparent substrate with a transparent conductive film.
Figure 4:
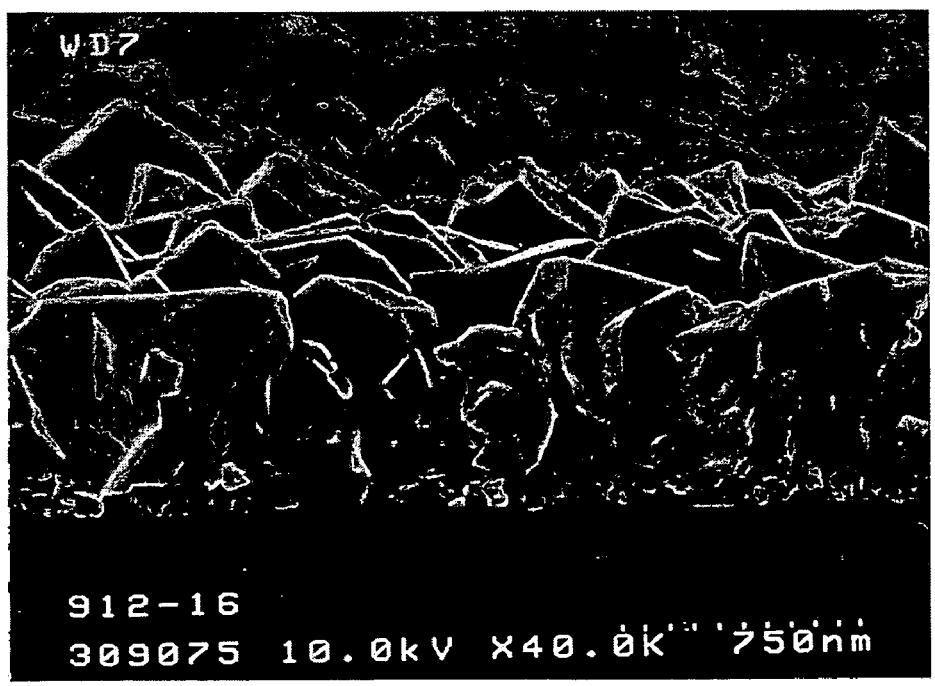
FIG. 4 is a view showing the state of the cross section of the transparent substrate with a transparent conductive film obtained in Example 3, which was observed with the SEM at an inclination of 10° with respect to the surface of the transparent substrate with a transparent conductive film.
Figure 5:
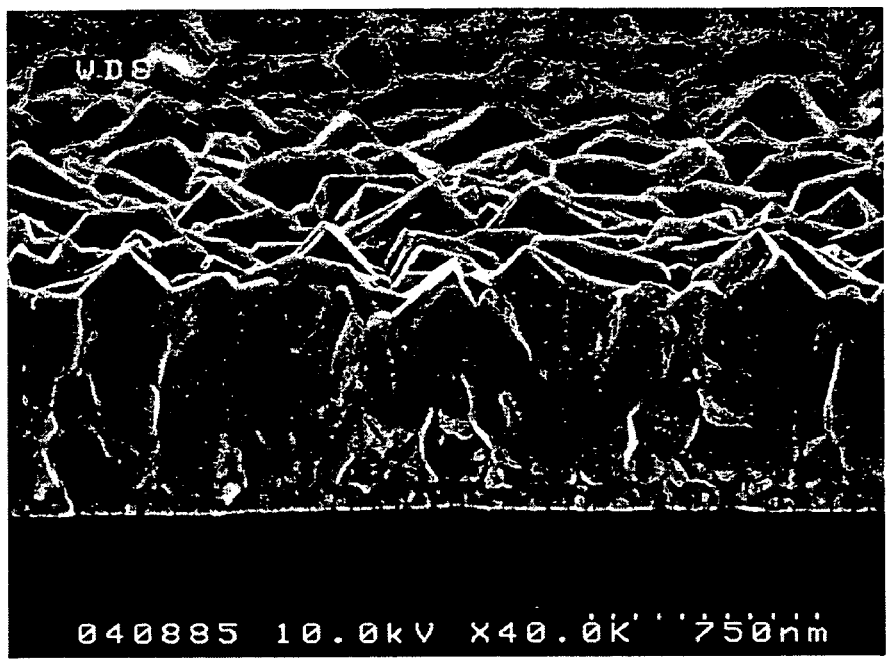
FIG. 5 is a view showing the state of the cross section of the transparent substrate with a transparent conductive film obtained in Example 7, which was observed with the SEM at an inclination of 10° with respect to the surface of the transparent substrate with a transparent conductive film.
Figure 6:
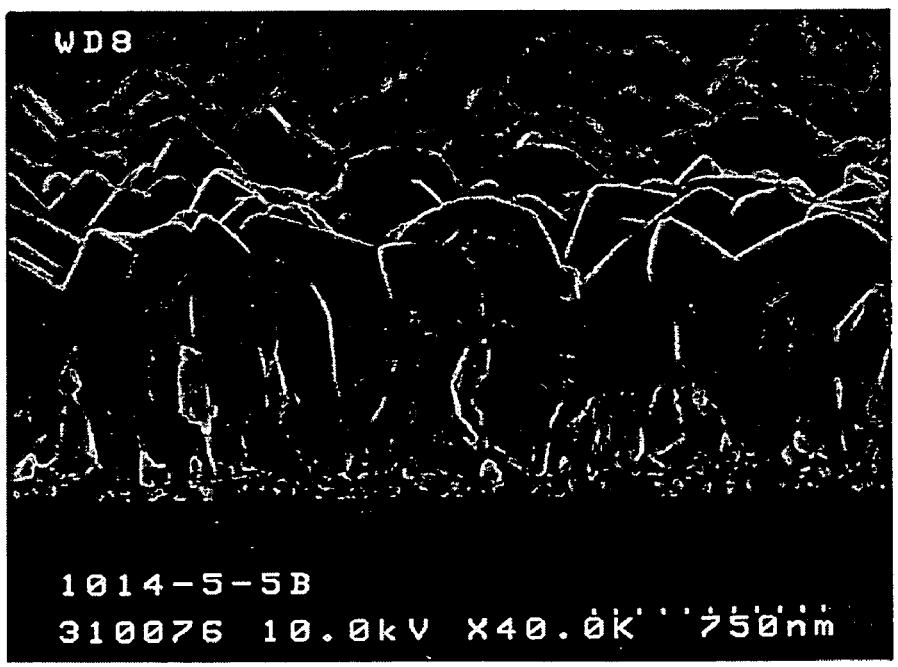
FIG. 6 is a view showing the state of the cross section of the transparent substrate with a transparent conductive film obtained in Comparative Example 1, which was observed with the SEM at an inclination of 10° with respect to the surface of the transparent substrate with a transparent conductive film.
Figure 7:
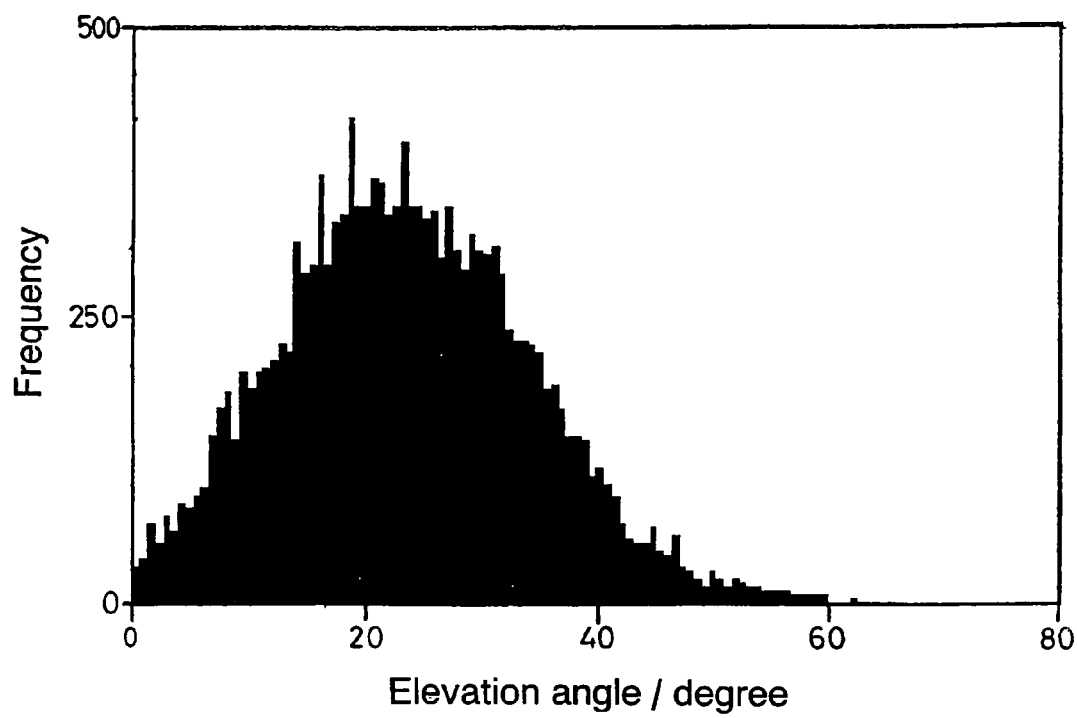
FIG. 7 is a histogram with respect to elevation angles of convexities present at the surface of the transparent conductive film obtained in Example 7.
Figure 8:
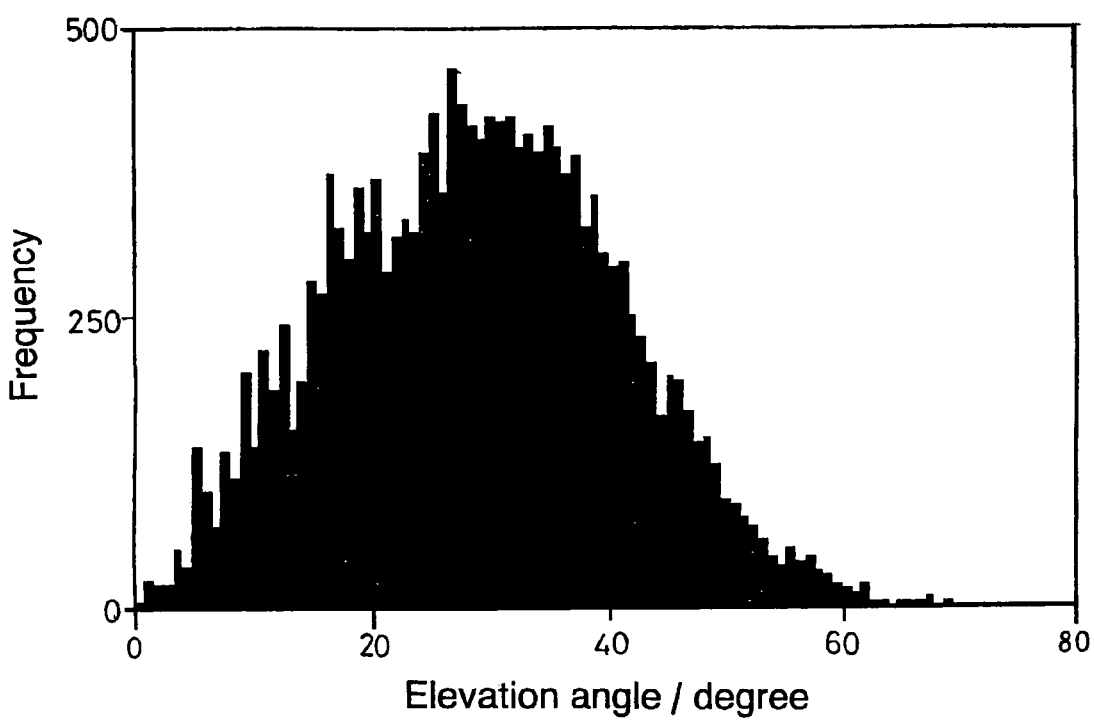
FIG. 8 is a histogram with respect to elevation angles of convexities present at the surface of the transparent conductive film obtained in Comparative Example 2.

No dome-shaped convexities that projected locally were observed at the surface of the transparent conductive film formed in each example (see FIGS. 3 to 5).

In Examples 1 to 5 and 8 to 9 as well as Comparative Examples 1 and 2 that were carried out using the on-line CVD method, the glass ribbon had a surface temperature of 620° C. to 690° C. in forming the transparent conductive film. In Examples 6 and 7, the temperature of the glass sheet was about 660° C. in forming the transparent conductive film.

INDUSTRIAL APPLICABILITY

The transparent substrate with a transparent conductive film of the present invention are very useful as a member of photoelectric conversion elements such as solar cells, optical sensors, etc., displays such as liquid crystal displays, organic EL displays, plasma displays, etc., and light emitting devices such as FEDs, light emitting diodes, solid state lasers, etc.

The invention claimed is:

1. A method of manufacturing a transparent substrate with a transparent conductive film, comprising a process of forming a transparent conductive film containing crystalline metal oxide as its main component on a transparent substrate by a pyrolytic oxidation method,

TABLE 1

|  | HCl/SnCl₄ (Mole Ratio) | | | Thickness of TCF (nm) | Sheet Resistance (Ω/□) | Haze Ratio (%) | Max. of Peak Areas other than (110) Plane | Elevation Angle Average (°) | Convexity Diameter Average (nm) |
| --- | --- | --- | --- | --- | --- | --- | --- | --- | --- |
|  | First Step | Second Step | Third Step |  |  |  |  |  |  |
| Ex. 1 | 1.2 | 5.0 | 0.2 | 700 | 9.5 | 19.5 | 43 | 27.5 | 378 |
| Ex. 2 | 1.2 | 3.0 | 0.2 | 720 | 10.2 | 28.0 | 38 | 27.9 | 442 |
| Ex. 3 | 2.4 | 3.0 | 0.2 | 687 | 12.7 | 36.9 | 26 | — | — |
| Ex. 4 | 1.2 | 7.0 | 0.05 | 611 | 13.7 | 15.5 | 67 | — | — |
| Ex. 5 | 1.8 | 3.0 | 0.2 | 700 | 8.9 | 16.5 | 41 | 27.8 | 387 |
| Ex. 6 | 2.6 | 7.8 | 0.16 | 740 | 11.5 | 25.5 | 55 | — | — |
| Ex. 7 | 0.8 | 7.8 | 0.73 | 740 | 9.9 | 19.3 | 38 | 23.9 | 414 |
| Ex. 8 | 1.0 | 3.0 | 0.2 | 640 | 10.3 | 18.8 | 44 | 27.6 | 370 |
| Ex. 9 | 3.0 | 5.0 | 1.2 | 700 | 11.0 | 23.0 | 42 | 26.5 | 419 |
| C. Ex. 1 | 0.06 | 0.05 | 0.2 | 810 | 14.0 | 14.5 | 118 | — | — |
| C. Ex. 2 | 0.2 | 0.03 | 0.2 | 960 | 9.0 | 25.8 | 153 | 31.6 | 379 |

\* First Step, Second Step, and Third Step denote steps of forming a first tin oxide film, a second tin oxide film, and a tin oxide film doped with fluorine, respectively.
\* The peak areas are relative values expressed with the peak area of the (110) plane being set at 100.
\* The elevation angle average and the convexity diameter average were not measured in some samples.
\* In Table 1, "Ex." and "C. Ex." denote Example and Comparative Example, respectively.
\* In Table 1, "Thickness of TCF" indicates the thickness of the transparent conductive film.

in the method, a gaseous material containing a metal compound, an oxidizing material, and hydrogen chloride being supplied onto the transparent substrate, wherein the process comprises sequentially:

a first step in which a mole ratio of the hydrogen chloride to the metal compound in the gaseous material is 0.5 to 5 and crystalline initial grains are formed on the transparent substrate;

a second step in which the mole ratio is 2 to 10 and is higher than the mole ratio to be employed in the first step, and crystals of the metal oxide grow with the crystalline initial grains serving as starting points; and a third step in which the mole ratio is lower than 1.5 and the crystal growth is promoted.

2. The method of manufacturing a transparent substrate with a transparent conductive film according to claim 1, wherein the mole ratio to be employed in the first step is 1 to 5.

3. The method of manufacturing a transparent substrate with a transparent conductive film according to claim 1, wherein the mole ratio to be employed in the first step is lower than 4, and the mole ratio to be employed in the second step is at least 3.

4. The method of manufacturing a transparent substrate with a transparent conductive film according to claim 1, further comprising a process of forming at least one undercoating layer on the transparent substrate, before the first step.

5. The method of manufacturing a transparent substrate with a transparent conductive film according to claim 1, further comprising a process of forming two undercoating layers on the transparent substrate, before the first step.

6. The method of manufacturing a transparent substrate with a transparent conductive film according to claim 1, wherein the transparent substrate is a glass ribbon having a surface temperature of at least 600° C. located on a molten metal bath in a process of manufacturing glass by a float glass process.

7. The method of manufacturing a transparent substrate with a transparent conductive film according to claim 1, wherein the metal compound is a tin compound, and a metal oxide is tin oxide.

* * * * *